United States Patent [19]
Sowards et al.

[11] Patent Number: 5,623,436
[45] Date of Patent: Apr. 22, 1997

[54] METHOD AND APPARATUS FOR ADJUSTMENT AND CONTROL OF AN ITERATIVE METHOD OF RECORDING ANALOG SIGNALS WITH ON-CHIP TRIMMING TECHNIQUES

[75] Inventors: David Sowards, Fremont; Trevor Blyth, Milpitas; Sakhawat Khan, Santa Clara; Lawrence Engh, Redwood City, all of Calif.

[73] Assignee: Information Storage Devices, San Jose, Calif.

[21] Appl. No.: 334,589

[22] Filed: Nov. 4, 1994

Related U.S. Application Data

[63] Continuation of Ser. No. 78,420, Jun. 17, 1993, abandoned.

[51] Int. Cl.$^6$ .................................................. G11C 27/00
[52] U.S. Cl. ................. 365/45; 365/185.03; 365/189.07
[58] Field of Search ................................ 365/45, 185.03, 365/168, 189.07

[56] References Cited

U.S. PATENT DOCUMENTS

| | | | |
|---|---|---|---|
| 4,558,431 | 12/1985 | Satoh | 365/45 |
| 4,890,259 | 12/1989 | Simko | 365/45 |
| 4,989,179 | 1/1991 | Simko | 365/45 |
| 5,166,562 | 11/1992 | Allen | 365/45 |
| 5,220,531 | 6/1993 | Blyth et al. | 365/185 |
| 5,239,500 | 8/1993 | Oguey | 365/45 |
| 5,241,494 | 8/1993 | Blyth et al. | 365/185 |

*Primary Examiner*—A. Zarabian
*Attorney, Agent, or Firm*—Blakely, Sokoloff, Taylor & Zafman

[57] ABSTRACT

Method and apparatus for adjustment and control of an iterative method of recording analog signals with on-chip trimming techniques for later playback. The invention allows setting of various parameters for the multi iterative programming technique after chip fabrication so as to allow tighter control and thus higher resolution analog signal sample storage in a given or minimum amount of time. Such parameters include, but are not limited to: the step down voltage from the coarse programming cycle to the fine programming cycle, the incremental voltage increase between each fine pulse, the pulse width of each fine pulse, the number of fine pulses, the incremental voltage increase between each coarse pulse, the pulse width of each course pulse, the number of coarse pulses, and the offset, VOS, which stops further coarse pulses and holds the last coarse level as a reference for the following fine cycle.

36 Claims, 14 Drawing Sheets

METHOD AND APPARATUS FOR ADJUSTMENT AND CONTROL OF AN ITERATIVE METHOD OF RECORDING ANALOG SIGNALS WITH ON-CHIP TRIMMING TECHNIQUES

This is a continuation of application Ser. No. 08/078,420 filed Jun. 17, 1993 abandoned.

BACKGROUND OF THE INVENTION

1. Field of the Invention

The present invention relates to the field of non-volatile integrated circuit analog signal recording and playback devices wherein an analog signal is directly stored in and read back from a storage cell.

2. Prior Art

Application Ser. No. 07/588,949 discloses a high density integrated circuit, analog signal recording and playback system wherein an analog input signal is sampled a plurality of times and then, as additional samples are being taken and temporarily held, a prior set of samples of the analog signal are simultaneously loaded into an equal plurality of storage sites or memory cells, preferably EEPROM cells. In that system the read process and circuitry connects each electrically alterable MOS storage device in a source follower configuration, which provides a one-to-one relationship between the variation of the floating gate storage charge (voltage) and the variation in the output voltage, with an insensitivity to load characteristics. That system's write process and circuitry provides a multi iterative programming technique wherein a series of coarse pulses program a cell to the approximate desired value, with a series of fine pulses referenced to the last coarse pulse being used for programming the respective cell in fine increments to a desired final programming level. The iterative write process is also disclosed in detail in application Ser. No. 07/636,879, with products generally in accordance with these disclosures being sold by Information Storage Devices, the assignee of the present invention, as its ISD1016 devices.

BRIEF SUMMARY OF THE INVENTION

Method and apparatus for adjustment and control of an iterative method of recording analog signals with on-chip trimming techniques for later playback. The invention allows setting of various parameters for the multi iterative programming technique after chip fabrication so as to allow tighter control and thus higher resolution analog signal sample storage in a given or minimum amount of time. Such parameters include, but are not limited to:

1) the step down voltage from the coarse programming cycle to the fine programming cycle. This is required to ensure that the first fine pulses do not cause programming, i.e. add charge increments to the floating gate cells which are greater than the expected amount for each fine pulse in the center of the fine programming cycle when it has reached equilibrium. In particular, each fine pulse in the center of the cycle causes essentially an equal amount of charge increment to the floating gate of the EEPROM cell.
2) the incremental voltage increase between each fine pulse.
3) the pulse width of each fine pulse.
4) the number of fine pulses.
5) the incremental voltage increase between each coarse pulse.
6) the pulse width of each coarse pulse.
7) the number of coarse pulses.
8) the offset, VOS, which stops further coarse pulses and holds the last coarse level as a reference for the following fine cycle.

DETAILED DESCRIPTION OF THE INVENTION

The preferred embodiment of the present invention represents a substantial improvement in the methods and apparatus for iterative writing a signal sample to an MOS storage cell for integrated circuit analog recording and subsequent playback disclosed in copending U.S. Patent application Ser. No. 07/636,879, filed Jan. 2, 1991 and issued on Jun. 15, 1993 as U.S. Pat. No. 5,220,831. To provide a basis for understanding the nature of the improvement and the environment in which the preferred embodiment is intended to operate, a substantial part of the disclosure of that earlier application is repeated herein.

Figure 1:
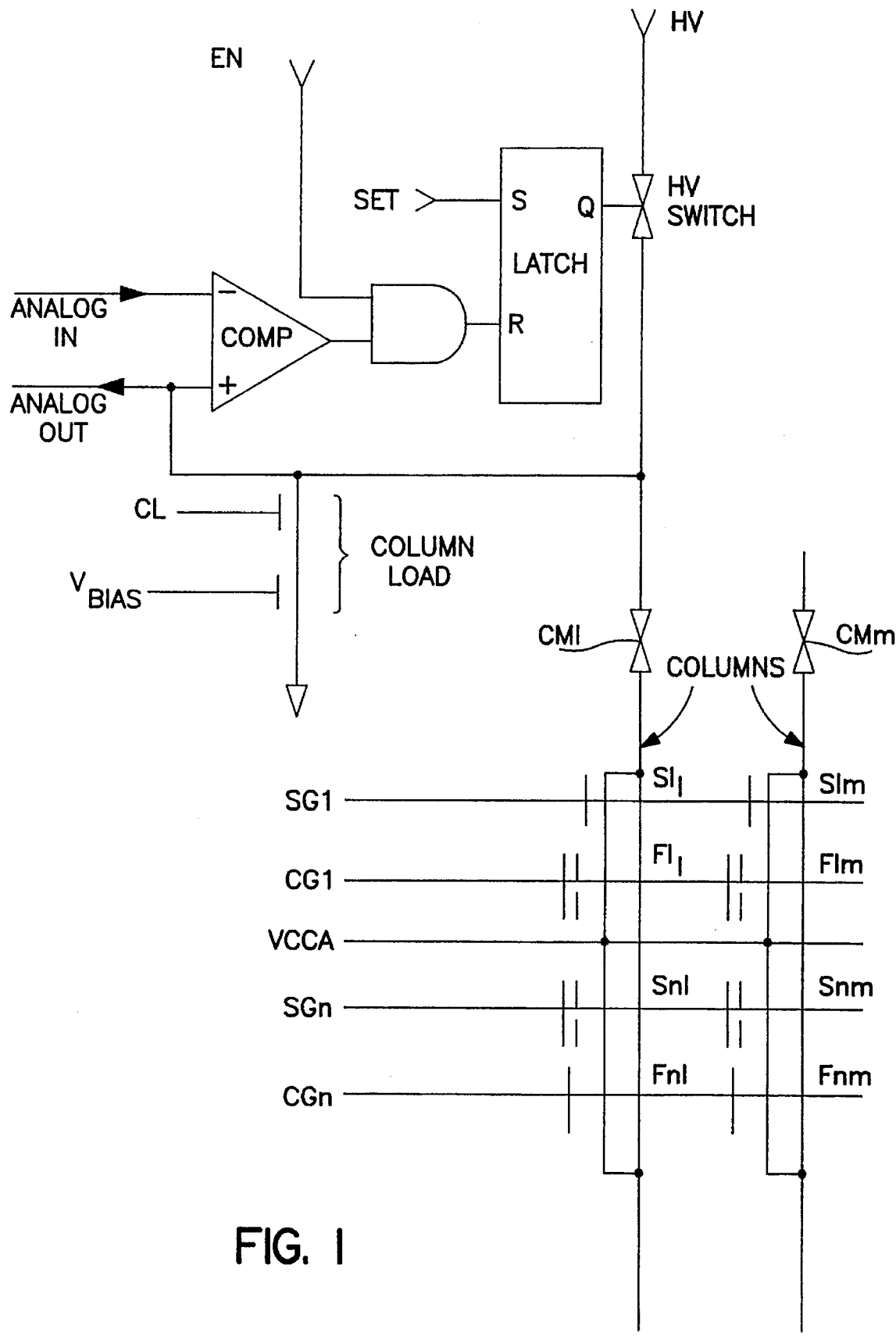
FIG. 1 is a schematic circuit diagram of a part of a memory array and associated circuitry of an analog storage device in accordance with the present invention.

First referring to FIG. 1, a basic implementation of that invention may be seen. This figure represents a section of a typical memory array with one column driver consisting of comparator COMP, latch, high voltage (HV) switch and column load, column multiplexer comprising switches CM1 to CMm and a memory array consisting of n rows and m columns of transistor pairs Snm and Fnm. This figure of coarse is representative of one specific embodiment as, for example, there may be more than one column driver multiplexed (or not multiplexed) into the array, there may be more than one level of multiplexing of each column driver into the array, etc. Also the figure shows a single common node VCCA, but it may equally be separated into different nodes. For the purposes of the description of the first embodiment of that invention, the high voltage switch is shown as a simple switch, though in another embodiment disclosed herein the same consists of two switches, together with means to superimpose a fine adjustment voltage on a coarse voltage to more accurately program the storage cell within the typical available time for doing so.

A recording is made by the following sequence. The cells to be written (programmed) are first erased (cleared). This is done by applying a high voltage to the clear gate CGn while maintaining a low voltage on the drain of the cell. In the circuits of that embodiment, each row has an independent connection in order to facilitate the clearing of each row independently without disturbing the analog samples recorded in other parts of the memory. The low drain voltage is achieved by applying a low voltage to VCCA. Since the high voltage on the clear gate causes the floating gate transistor to be in a conductive state, the low voltage is transposed to the drain. It would also be possible to apply the drain voltage through the column and select gate.

The voltage to be written is applied to ANALOG IN, a SET signal is applied to set the latch and turn on the HV switch, CL is taken low, all CG lines are taken low, and the desired column multiplex lines (CMm) and select gate lines (SGn) are taken high. Unselected columns and rows have their CM and SG lines low. The first high voltage pulse is then applied to HV and via the CMm and SGn transistors to the drain of the addressed cell. The level on CMm and SGn must be sufficient to pass the desired level onto the cell drain. In the preferred embodiment of that invention, CM and SG are higher than HV so that HV, the regulated signal, is connected onto the drain without any loss of voltage. It would also be possible to regulate CM and/or SG in order to pass the desired level onto the drain. As HV is applied to the drain, VCCA is also brought positive. In the preferred embodiment of that invention, the VCCA level, at this point in the procedure, is about 7 volts—this being higher than the maximum level to which the Fnm transistor would otherwise pull VCCA by follower action. (Note that although CGn is at VSS, the capacitive coupling onto the floating gate causes the transistor to conduct even though it may be strongly cleared.) The purpose is to ensure that the column voltage does not become suppressed due to a current path to VCCA. Non-Suppression of VCCA could also be achieved by allowing VCCA to float, which may be satisfactory for VCCA nodes with small capacitance values and high voltage sources with low source impedance values. These values generally do not occur in practice. Now that the cell is in this writing condition, electron tunneling may occur from floating gate to drain, resulting in a net increase in the positive charge residing on the float gate. After a certain time period HV (and VCCA) is brought low, in the preferred embodiment, and the discharge rate is controlled to avoid unnecessary perturbations onto other nodes.

The cell is now configured into the read mode. CL is taken high (connecting the current load onto the column), CMm and SGn remain high to keep the same cell addressed (although not necessarily at the same high voltages as before) and VCCA is taken to a positive voltage. Note that this configuration is a reversal from digital memories where the VCCA node would be grounded. The total resistance of the Snm transistor and the column multiplex transistor(s) should be small compared to the effective resistance of the load. The clear gate CGn voltage is taken to a fixed level which is chosen to optimize the voltage storage range—in the case of the preferred embodiment that invention both VCCA and CGn are connected to 4 V. The voltage which is now output on the column is compared with ANALOG IN. EN is brought high and if ANALOG OUT is greater than ANALOG IN, the output of the comparator goes high and resets the latch. The HV switch is thus opened and the subsequent HV pulses are not connected to the cell. (Typically such high voltage pulses are of successively increasing amplitude.) If, however, ANALOG OUT is less than ANALOG IN, then the latch remains set and the next HV pulse is applied to the cell and the cells obtains another increment of tunnel current. The cell is alternatively configured in write mode and then read mode until a comparison is reached or a maximum number of cycles has been reached.

To play back the recording, the circuit is configured continuously into the read mode. The configuration and the cell operating conditions are exactly the same as during the write comparison and thus an accurate reproduction is achieved.

The resolution of analog recording is improved if the voltage increment on the EEPROM floating gate resulting from each high voltage iteration is as small as possible. In the case of commercially available speech recording devices, resolutions range from 6 bits to 16 bits of equivalent digital resolution. The recording method employed herein causes the voltage on the floating gate to be incremented during each high voltage pulse. The resolution achieved depends on the width of the high voltage write pulses and also on the amount of voltage increment between each successive pulse. Better resolution (i.e. smaller voltage increments) is achieved with narrow pulses and/or with smaller voltage increments of the high voltage pulse. However, this means that to cover the same range of floating gate voltages (i.e. the same dynamic range), there must be an increased number of applied high voltage pulses. In a given recording architecture there is a certain amount of time available to perform the writing of one row before beginning the write of the next row. This limits the number of pulses which can be applied and consequently limits the resolution which can be achieved. If the high voltage pulses increase linearly over the complete range, then each increment would give approximately equal increments to the floating gate. The first few pulses (which generally would follow an erase cycle) would probably cause a larger increment than subsequent pulses, but this is the major exception.

Figure 2:
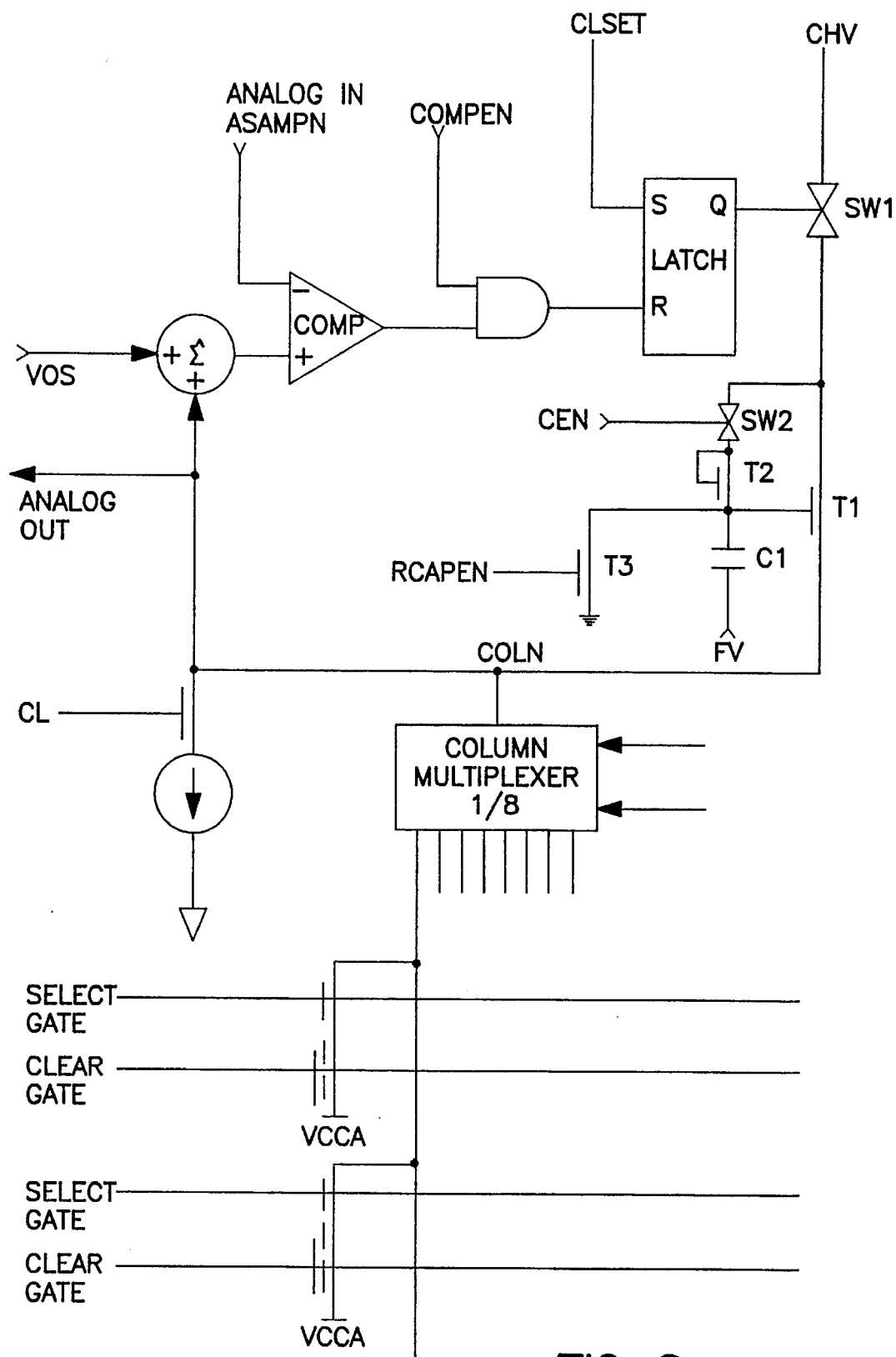
FIG. 2 is a schematic block diagram of a part of a memory array and associated circuitry of an analog storage device in accordance with an alternate and preferred embodiment of the present invention.

The technique used in the preferred circuit of FIG. 2 of that invention uses two bursts of voltage pulses (the method could be extended to more bursts). The first burst of pulses has monotonically increasing voltage levels (beginning with a level which produces a weakly programmed cell and ending with a level which produces a strongly programmed cell—i.e. from 8 volts to 18 volts). These will be called the coarse pulses. Coarse pulses are applied to the cell until the cell reaches a point where an additional pulse would program it to a level which is beyond the desired level. A second burst of pulses is now applied which has a reduced voltage increment between adjacent pulses. These are termed the fine pulses. The voltage level of the first pulse in the fine burst is related to the level of the last coarse pulse applied to the cell. It can be the same level, slightly higher or slightly lower, but the important thing is that it is a function of the last coarse pulse height. Fine pulses are applied to the cell until the cell is programmed to the desired level. The voltage level of the fine pulses may also have monotonically increasing values, but the voltage increment is much smaller than the increment during the coarse cycle. The fine pulses may also be of a narrower width than the coarse pulses.

In this scheme, the resolution of the floating gate voltage is determined by the voltage increment attained during the fine cycle. The voltage range, however, is determined by the coarse cycle.

Consider an ideal situation where:

Vr=Dynamic voltage range.

Vc=Floating gate voltage increment during coarse pulses

Vf=Floating gate voltage increment during fine pulses

NC=Number of coarse pulses

Nf=Number of fine pulses

Then,

NC=Vr/Vc

Nf=Vc/Vf and $N_{total}$=NC+Nf

If the circuit did not use this dual (or multi) increment technique however, and the same resolution was required, then the total number of pulses required to cover the range would be:

$N_{total}$=Vr/Vf=Vr/(Vc/Nf)=Nc*Nf

As an example, suppose we have a range of 1 V, a coarse increment of 0.1 V and a fine increment of 10 mV. Using the dual increment technique a total of 20 high voltages would be required versus 100 pulses with pulses of uniformly increasing magnitude.

In practice, the number of pulses required is greater than the ideal case because: 1) one must begin the coarse high voltage pulses at a lower level and continue past the ideal high level in order to account for manufacturing tolerances which change the relationship between the applied high voltage signals and the resulting voltages on the floating gate (e.g. variations in tunnel threshold). This is necessary when using either technique. 2) there must be a sufficient number of fine pulses to cover the complete voltage span of a single coarse step. At the upper end this is a similar problem to 1), but at the lower end it is due to practicalities in circuits which are used to implement the technique.

A block diagram of a circuit which utilizes a dual increment (coarse/fine) technique is shown in FIG. 2. In addition to the components of FIG. 1, there is an extra switch SW2, transistors T1, T2 and T3, capacitor C1 and a voltage summing junction. To initialize the circuit, a pulse is applied to CLSET to set the latch, CEN is set high to close SW2 and a pulse is applied to RCAPEN to discharge C1. The burst of coarse pulses is then applied to CHV and consequently is also applied to the cell provided that the latch remains set and SW1 is closed, as described previously. One important difference with this implementation compared to the basic circuit is that the connection of CHV to COLN is through the transistor T1. T1 requires a voltage on its gate which, in turn is provided by SW2 and T2. During the time that the cell voltage is read and compared with ANALOG IN, a voltage Vos is added to the voltage on COLN. The value of Vos is equal to or slightly greater than the floating gate voltage increment that results from a single coarse pulse. Adding Vos before the comparison is made with ANALOG IN ensures that the latch is reset one coarse pulse earlier than would otherwise occur. At this time, the latch is reset and the cell is thus programmed to a level which is no more than one coarse increment below the desired level. Also the gate voltage on T1 which corresponds to the last coarse pulse before comparison is stored on C1.

The latch is now set once more by applying a pulse to CLSET, CEN is taken low to open SW2 and the second burst of high voltage (fine) pulses are applied to CHV. These pulses are all of maximum amplitude, but the voltage which is transferred onto COLN through T1 depends on the stored level on C1 and the follower action of T1. The stored level on C1 is modulated by the signal FV, which in the preferred embodiment, is a ramp which begins at a low level (VSS) at the beginning of the fine cycle and rises to a higher level (2 V) at the end of the fine cycle. The magnitude of the high voltage pulses which are connected to the cell during the fine cycle is therefore dependent on the highest value reached during the coarse cycle and with increasing amplitudes as determined by FV. As with the coarse cycle, after each high voltage pulse the cell voltage is read and compared with ANALOG IN. During the fine cycle, however, Vos is held at VSS and the cell voltage is incremented in fine increments until a comparison is made.

Figure 3:
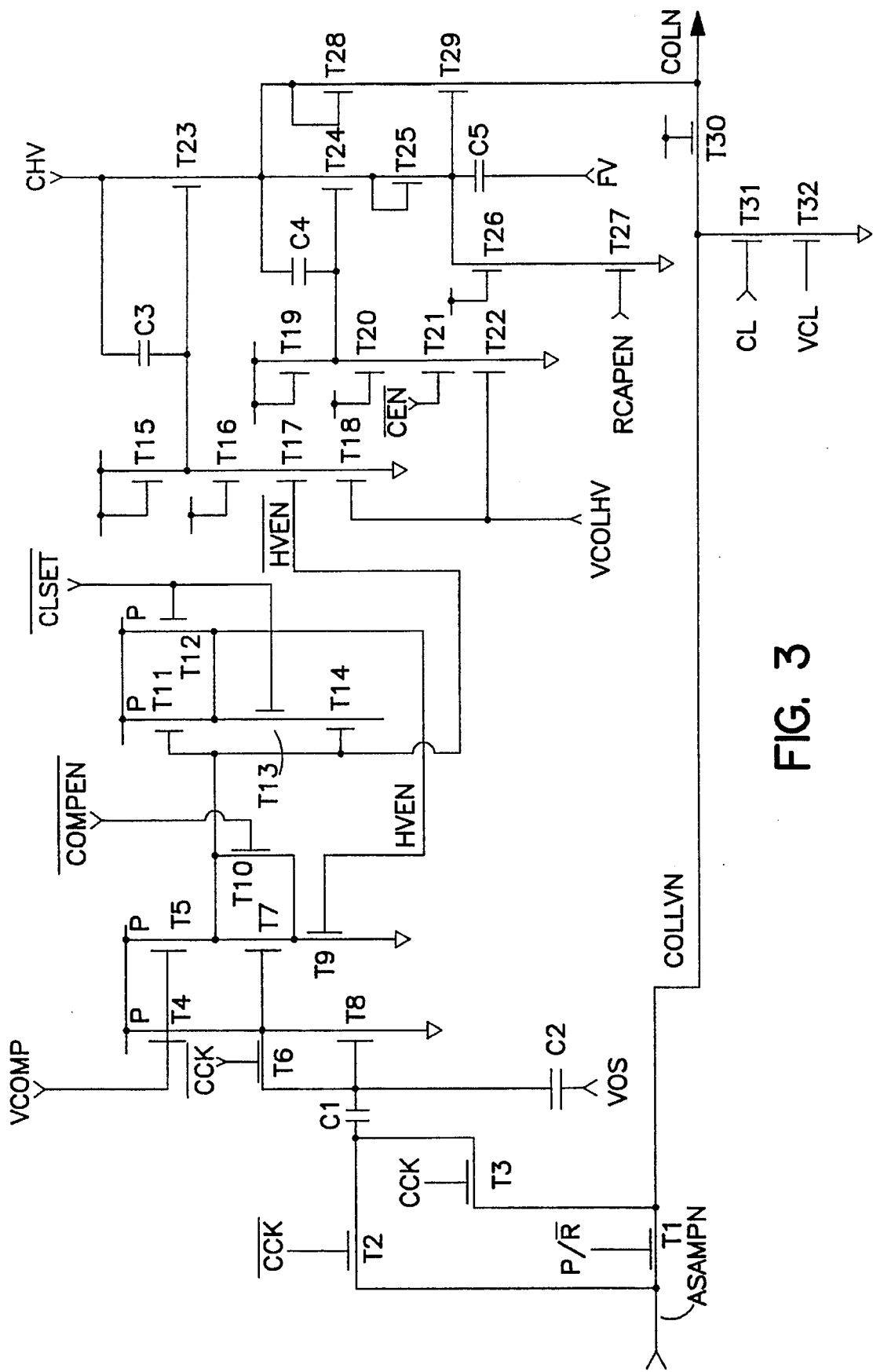
FIG. 3 is a detailed schematic diagram for the diagram of FIG. 2.

FIG. 3 shows a detailed schematic of the circuit. T2, T3, T4, T6, T8 together with C1 and C2 create an offset canceled comparator; T5, T7, T9, T10, T11, T12, T13 and T14 create an additional gain stage and latch; T15, T16, T17, T18, T23 and C3 create a high voltage switch; T19, T20, T21, T22, T24 and C4 create another high voltage switch; C5 is a holding capacitor and T29 acts as a source follower.

The write sequence begins with an erase cycle. In the following description it is assumed that the addressed cell has already been fully erased. When reading, the cell is configured in a source follower mode as previously described. The signal VCL applies a bias to T32 such that T30, T31, and T32 act as a load to VSS. (T30 is included to increase the voltage breakdown on the COLN node). This technique could also be utilized if the cell were configured in the arrangement which is more conventional to memory arrays, but an inversion would be necessary (for instance between the cell and COLN).

At the beginning of the write (programming) cycle, a negative pulse is applied to $\overline{\text{CLSET}}$ and a positive pulse is applied to RCAPEN. This sets the latch (HVEN goes high) and discharges C5 to 0V. VCOMP provides a bias such that T4 and T5 act as high impedance load devices. Likewise, VCOLHV cause T18 and T22 to behave as load devices, in this case to VSS. P/$\overline{\text{R}}$ is held low and is only allowed to go high during playback. $\overline{\text{CEN}}$ is initially held low. CL is low during write and high during read. The voltage which is desired to be written into the EEPROM cell is applied to ASAMPN. The first high voltage pulse of the coarse cycle is applied to CHV. It could typically be about 10 V amplitude with a finite rise time and pulse duration. Since $\overline{\text{HVEN}}$ is low, T17 is off and the voltage on the gate of T23 rises as a result of the CHV ramp on C3. Other capacitances on the gate of T23 are small relative to C3 and consequently there is very little capacitive or voltage division. There is also the self bootstrap effect of T23 itself and so the gate of T23 increases in voltage by an amount almost equal to CHV. The starting voltage on T23 gate was (VCC–Vt) or about 4 V, so with Vt typically about 1 V, the transistor T23 is turned fully on and CHV is conducted onto C4. The components T15, T16, T17, and T18, T23 and C3 operate like a high voltage switch enabled by $\overline{\text{HVEN}}$ (other implementations of the switch are possible). In a similar fashion, the other switch using T24 also conducts and C5 is charged to (CHV–Vt)– the Vt drop is due to T25. T29 now conducts and allows COLN to rise to (CHV–Vt–Vtn). Vt is the enhancement threshold (of T25), and Vtn is the threshold of native transistor T29. It is assumed that the Vt of T28 is less than or equal to T25. Hence the CHV pulse is applied to COLN and subsequently to the cell with a small amount of voltage drop due to thresholds. After CHV is returned to its low level, the voltage read from the cell is compared with ASAMPN. $\overline{CCK}$ and CCK are inverse signals; $\overline{CCK}$ is initially high and gates ASAMPN on to C1 via T2. T6 is also driven by $\overline{CCK}$ and biases the invertor T8/T4 in its linear region and cancels the offset. T7 gate has the same voltage as (matched) T8 and its source is at VSS, so the invertor T5, T7, T9 is also in the linear region. $\overline{CCK}$ then goes low and CCK goes high. The cell has since been configured in its read mode and thus the cell voltage is coupled onto C1. The change in voltage on the LHS of C1 is coupled onto the gate of T8. (It is important that $\overline{CCK}$ goes low before CCK goes high in order to ensure that there is no charge loss through T6). Simultaneously, a positive going signal is applied to Vos (in the preferred embodiment it is 1.5 V, derived from analog signal ground) and couples additional charge onto T8. The value of capacitor C2 is chosen so as to couple charge that is equivalent to a voltage slightly greater than the voltage increment that results on the floating gate during each coarse pulse. Since the invertor is in its linear region, the change at the gate of T8 causes a corresponding change in the drain of T8, multiplied by the gain of the invertor. The size of T6 is kept small so as to minimize the capacitive coupling from $\overline{CCK}$ to the input of the invertor. The coupling can be reduced further by connecting an equal capacitor to the gate of T8 but within equal and opposite phase of signal. This can be a "dummy" transistor similar to T6, or, as is often done, it can be a P-channel transistor in parallel with T6 and driven by an opposite signal. These steps were not taken, however, because the offset introduced here is a systematic offset which is equal in all similar circuits, including the reference circuit and is therefore canceled out. If the comparator were realized by some of the other techniques, such as those with differential input pairs of transistors, the random offset is ultimately superimposed on the recorded cell voltage. The comparator circuit is thus realized with a small number of components. The gain of the invertor (and the subsequent stage T7), can be increased by using a high impedance load device. In the case of this implementation the high impedance is achieved by using current mirror devices T4 and T5 in their saturated regions.

With the change is state of $\overline{CCK}$ and CCK, an amplified difference level exists on the gate of T7. After a short settling time, $\overline{COMPEN}$ is brought low. The drain of T7 was previously held low by T10, but it now is allowed to function as an additional gain stage, providing an amplified, non-iverted difference level at this point. The transistors T11 through T14 form a CMOS nand gate which is connected in a cross-coupled latch arrangement with the last gain stage. Transistors T5, T7, T9 and T10 serve a dual function—again stage and a latch. If the cell voltage plus the 0.2 V offset caused by Vos is less than ASAMPN the latch remains set (HVEN is high); if the cell voltage plus 0.2 V is greater than ASAMP the latch becomes reset when enabled by $\overline{COMPEN}$. The comparator is sensitive to input differences in the order of 1 mV. The systematic offset due to T6 coupling is about 17 mV, which is expected to be consistent to within 2 mV across chip. With 3 mV of overdrive the latch settles to the final logic state in 1 microsecond.

The signal $\overline{HVEN}$ is used to enable the first switch on the high voltage path. As long as the latch remains set, the switch is enabled and CHV pulses of continually increasing magnitude are applied to the cell. After the latch has been reset, the switch is disabled. CHV pulses may continue to be supplied, but they do not pass through the switch transistor T23 and no further coarse pulses are applied to COLN (the cell). The voltage on C4 has been increasing during each CHV pulse that $\overline{HVEN}$ was low. After $\overline{HVEN}$ goes high and the switch T23 stays open, the highest value reached is retained due to the diode action of T25 (RCAPEN is held low).

CHV pulses continue until their voltage level (and the number of pulses) has been sufficient to strongly program a cell. In this preferred design and process, the maximum CHV level is 21 V. After the last coarse CHV pulse, all latches in the column driver circuits should have been-set (provided that all the ASAMPN voltage levels are in the dynamic signal range).

The fine cycle now begins. $\overline{CEN}$ is taken high, thus disabling the second switch; $\overline{CLSET}$ is pulsed low and then high again, resetting the latch and enabling the first switch. Another burst of CHV pulses is supplied, this time of equal magnitude (21 V) but with half the repetition period of the coarse pulses. The shorter pulses allow a smaller amount of charge to be tunneled onto the floating gate during each high voltage pulse, as well as allowing more pulses of smaller voltage increments. The CHV pulses which are input to the circuit are of maximum amplitude, but the voltage which is applied to COLN depends on the stored voltage on the gate of T29 and the high voltage storage capacitor. As COLN rises with CHV, the coupling action onto the gate returns the gate voltage to precisely the same level that existed during the last coarse pulse and consequently the level applied to COLN is the same level as that which was applied during the last coarse pulse. There is provision in the circuit for applying adjustments to the COLN voltage, however. The bottom plate of C5 is driven by another external signal FV. The circuit would function if FV remained at a fixed voltage throughout the complete write operation, but enhanced performance is attained by manipulating FV. The preferred implementation of the circuit and its support circuits applies a ramp to FV. During the coarse cycle, FV is held at a fixed level of about 2 V and is brought to OV at the beginning of the fine cycle. FV ramps up linearly from OV at the beginning of the fine cycle to 2 V at the end of the fine cycle. This ramp is superimposed on the voltage stored on C5 and consequently on the voltage amplitude of the high voltage pulses applied to COLN.

During the fine cycle, Vos is held at a fixed voltage and not pulsed, as was the case during the coarse cycle. Thus the cell floating gate continues to increment in fine voltage steps until the read voltage is greater than ASAMPN, at which time the latch is set, switch T23 remains open and the cell does not receive any further pulses.

In the preferred embodiment of that invention, the coarse and fine programming characteristics are as follows:

| | |
|---|---|
| Number of coarse pulses | 45 |
| Number of fine pulses | 90 |
| Minimum coarse CHV voltage | 11 V |
| Maximum coarse CHV voltage | 21 V |
| Minimum coarse COLN voltage | 9 V |
| Maximum coarse COLN voltage | 18 V |
| Coarse CHV rise time | 420 mv/μsec |
| Fine CHV rise time | 840 mv/μsec |
| Coarse CHV pulse width (@ 1 v) | 100 μsec |
| Fine CHV pulse width (@ 1 v) | 50 μsec |
| FV ramp | 0–2 V |
| Vos pulse height | 1.5 V |

In the embodiment of that invention just described and for both series of programming pulses, once the read and compare operations find that the desired programming level for that series of pulses has been reached, a latch blocks further programming pulses of that series from passing to the cell, even though the read and compare operations are in fact continued until the end of the respective series of programming pulses. The continuance of the read and compare operations is an arbitrary design choice, but the blocking of further programming pulses of that series from passing to the cell once the desired compare is obtained is important, as otherwise subsequent noise might disturb a subsequent compare operation, allowing a much higher pulse of that series to pass to the cell, resulting in a single but large programming increment above the programming level desired.

The present invention may be described by first referring to FIG. 3, and noting that the multi iterative programming technique has several important parameters which determine its ability to accurately record the sampled analog signal. Such parameters include, but are not limited to:

1) the step down voltage from the coarse programming cycle to the fine programming cycle. This is required to ensure that the first fine pulses do not cause programming, i.e. add charge increments to the floating gate cells which are greater than the expected amount for each fine pulse in the center of the fine programming cycle when it has reached equilibrium. In particular, each fine pulse in the center of the cycle causes essentially an equal amount of charge increment to the floating gate of the EEPROM cell.

2) the incremental voltage increase between each fine pulse.

3) the pulse width of each fine pulse.

4) the number of fine pulses.

5) the incremental voltage increase between each coarse pulse.

6) the pulse width of each coarse pulse.

7) the number of coarse pulses.

8) the offset, VOS, which stops further coarse pulses and holds the last coarse level as a reference for the following fine cycle.

These parameters determine how well the multi iterative programming technique records the sampled signal, specifically how accurately, i.e. with how much resolution, the signal is recorded, in a given or minimum amount of time. With more time, these parameters can be adjusted to give additional resolution. However other factors, such as sample and hold time degradation, silicon area, and real time sampled data rates, limit the time available and therefore the number of pulses for the total recording cycle. With this limitation, the range of these parameters are designed to give the best performance, i.e. maximum resolution, minimum signal to noise ratio, most accurate storage of analog signal, minimum distortion, etc., based on the characteristics of the non-volatile storage cell. In any practical realization, these cell characteristics will vary between different manufactured circuits. The prior art adjusted for these manufacturing tolerances or variations by, 1) setting the range of several parameters wider than required, or 2), by adjusting each fixed parameter with each fixed fabrication tool set to match the observed variations.

The wider range of parameters such as the coarse increment, fine increment, number of pulses etc. does not optimize resolution, and later adjustments are costly and time consuming. Therefore it is desirable to have an improved method for reprogramming these parameters "on silicon" i.e. after fabrication, preferably at the wafer level or in packaged devices. The result of this reprogramming will achieve the following advantages.

1. It will obtain the maximum resolution for a given number of iterations which are allowed for a given programming cycle time, while allowing the algorithm to accommodate variations in the EEPROM cell characteristics.

2. It will make the fine ramp as shallow as possible, increasing the resolution to which the fine cycle can program a cell to match its analog sampled voltage.

3. It will make a more robust algorithm to maintain storage resolution during process improvements, changes, shrinks, etc.

Figure 4:
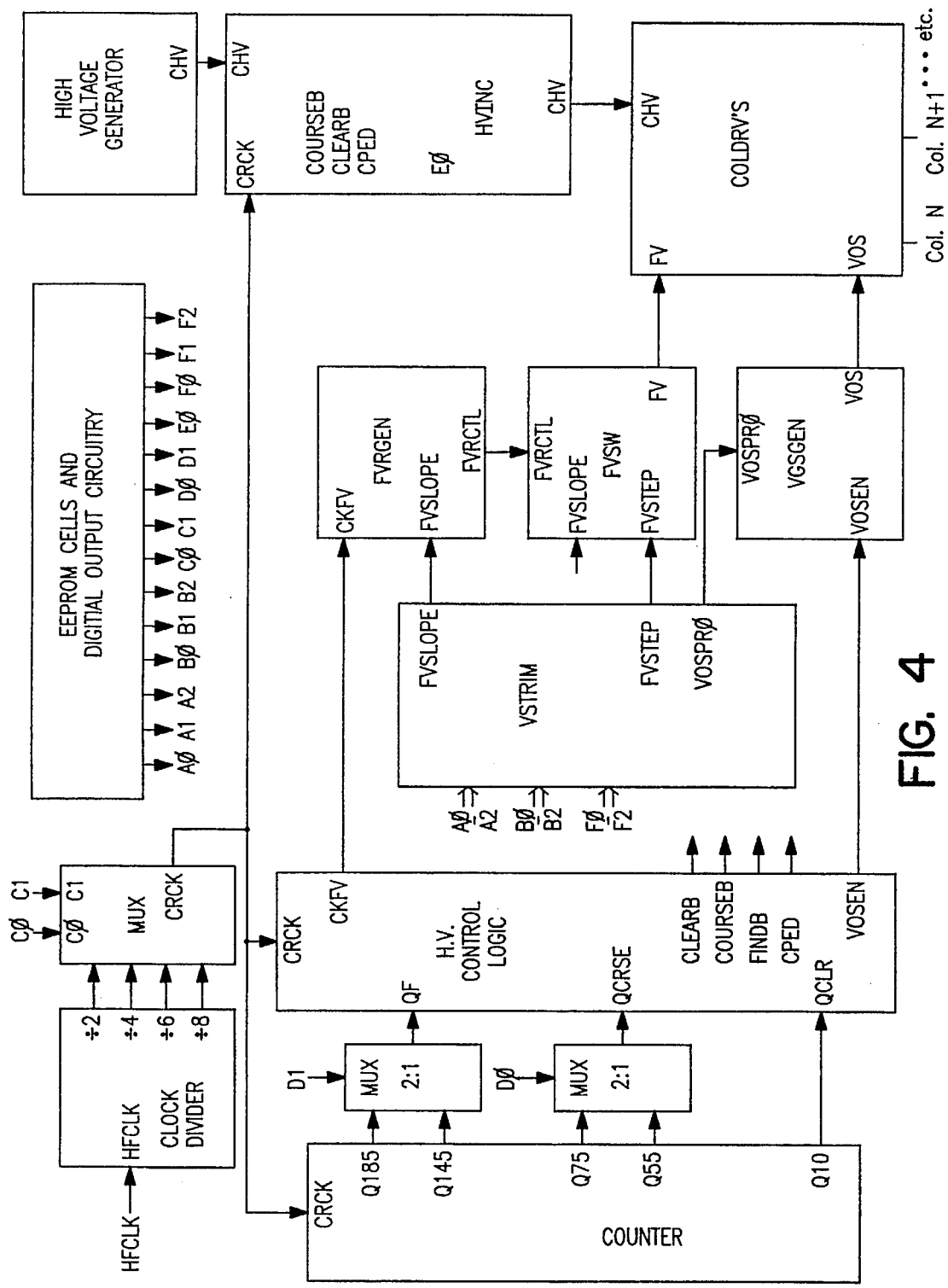
FIG. 4 shows a block diagram of typical EEPROM cells controlling blocks which adjust the multi iterative programming technique parameters.

The present invention allows for, but is not limited to, the control and adjustment of all the parameters hereinbefore set out. The preferred embodiment uses EEPROM cells which are programmed to a high or low level and with detection circuitry gives a fixed high or low digital logic level output. FIG. 4 shows a block diagram of typical EEPROM cells controlling blocks which adjust the multi iterative programming technique parameters. These levels are programmed to the EEPROM cells by a method executed external to the device, such as by a tester at wafer test time. How these programmed digital levels adjust the parameters are described below. However, even though digital levels are described, it should be obvious to anyone skilled in the art to use EEPROM cells in other configurations, such as, but not limited to, a stored analog level in the cell. Also anyone skilled in the art could use storage devices other than EEPROM cells in various other configurations.

Figure 5:
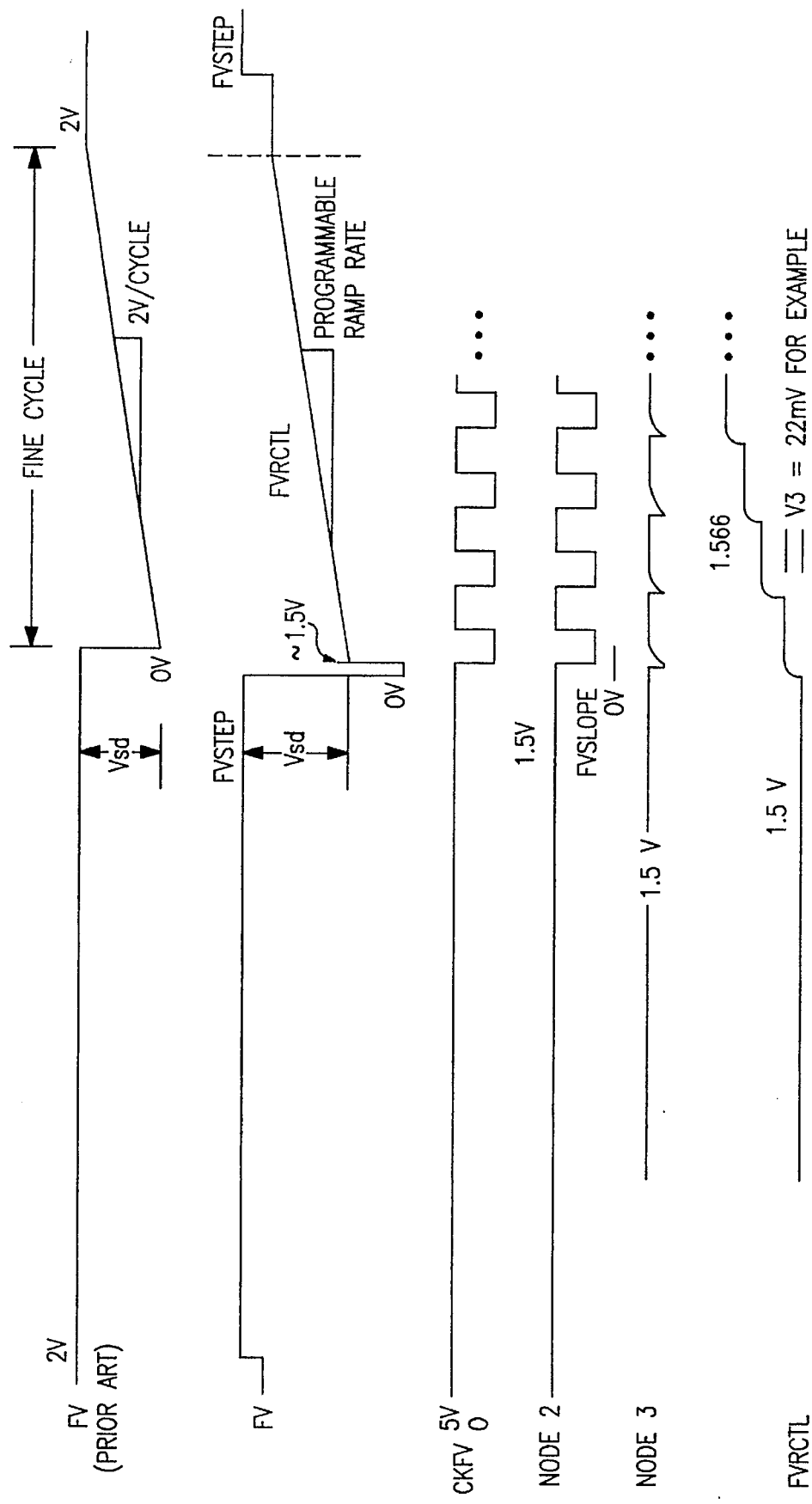
FIG. 5 illustrates the prior art wherein the voltage FV was switched from 2 v to 0 v at the beginning of the fine cycle and then charged back to a 2 v level by the end of the fine cycle.

The preferred embodiment of the invention allows for the control and adjustment of the first two parameters by controlling the FV signal of FIG. 3. These two parameters are, first, the step down voltage from the coarse cycle to the fine (VSD), and second, the incremental voltage increase between each fine pulse. In the prior art, the voltage FV was switched from 2 v to 0 v at the beginning of the fine cycle and then charged back to a 2 v level by the end of the fine cycle, as shown in FIG. 5. The fine cycle was comprised of 90 pulses. This caused the step down voltage (VSD) to be (2 v–0 v=2 v) and the ramp rate to be fixed at 2 v/cycle=2 v/90 pulses=22.2 mv/pulse. T were not independent of each other, i.e. when the VSD is determined, then the ramp rate is fixed by charging from 0 v to VSD, and vise versa, the ramp rate was VSD/90 voltage increment per pulse. The current invention separates these parameters and controls them individually as described below.

Figure 6:
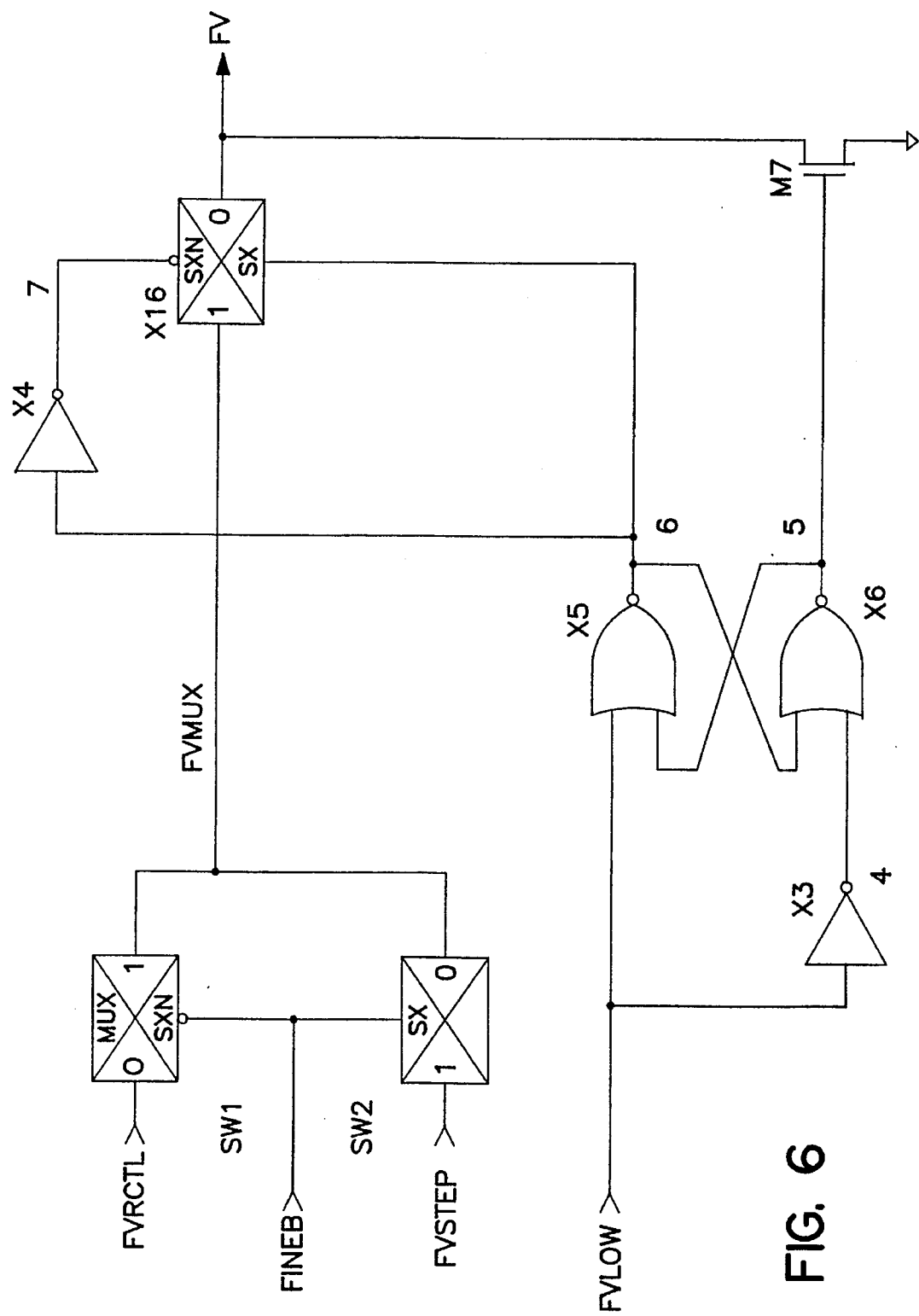
FIG. 6 is a circuit diagram showing a fixed voltage (FVSTEP) as applied to a switch SW2, which switch is closed during the coarse cycle and passes FVSTEP to FV which drives the bottom plate of C1 in FIG. 3.
Figure 7A:
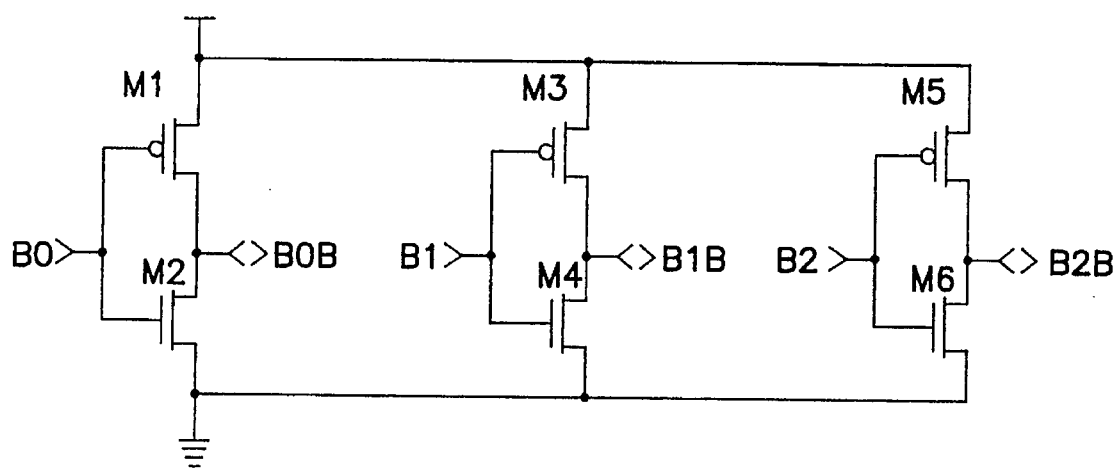
FIGS. 7A–7C are circuit diagram showing the circuit to control the value of FVSTEP.
Figure 7A:
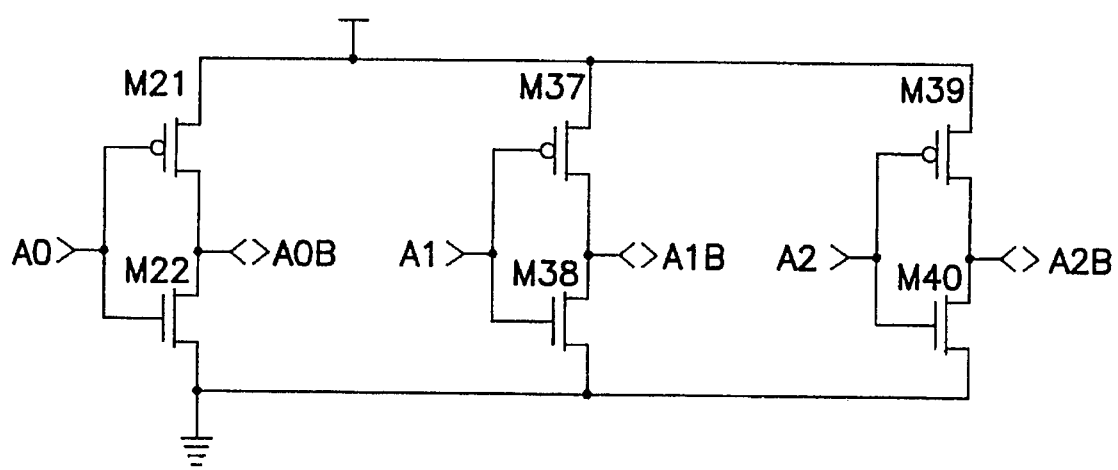
Figure 7A:
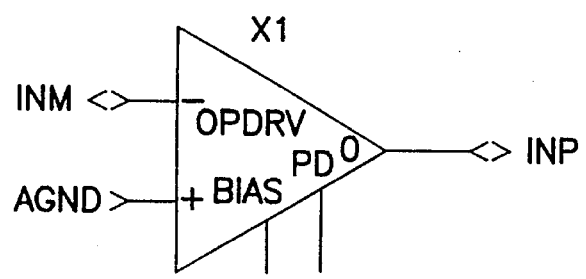
Figure 7B:
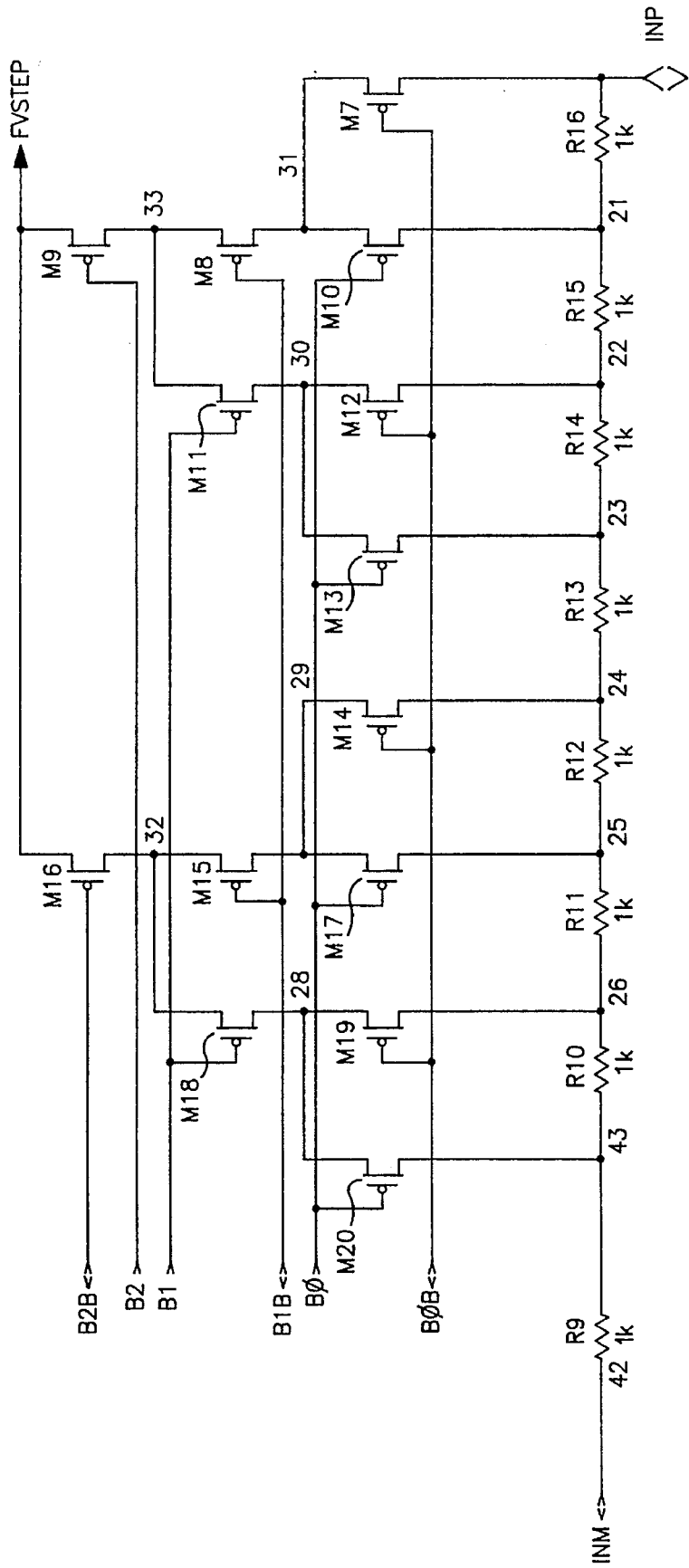
Figure 7C:
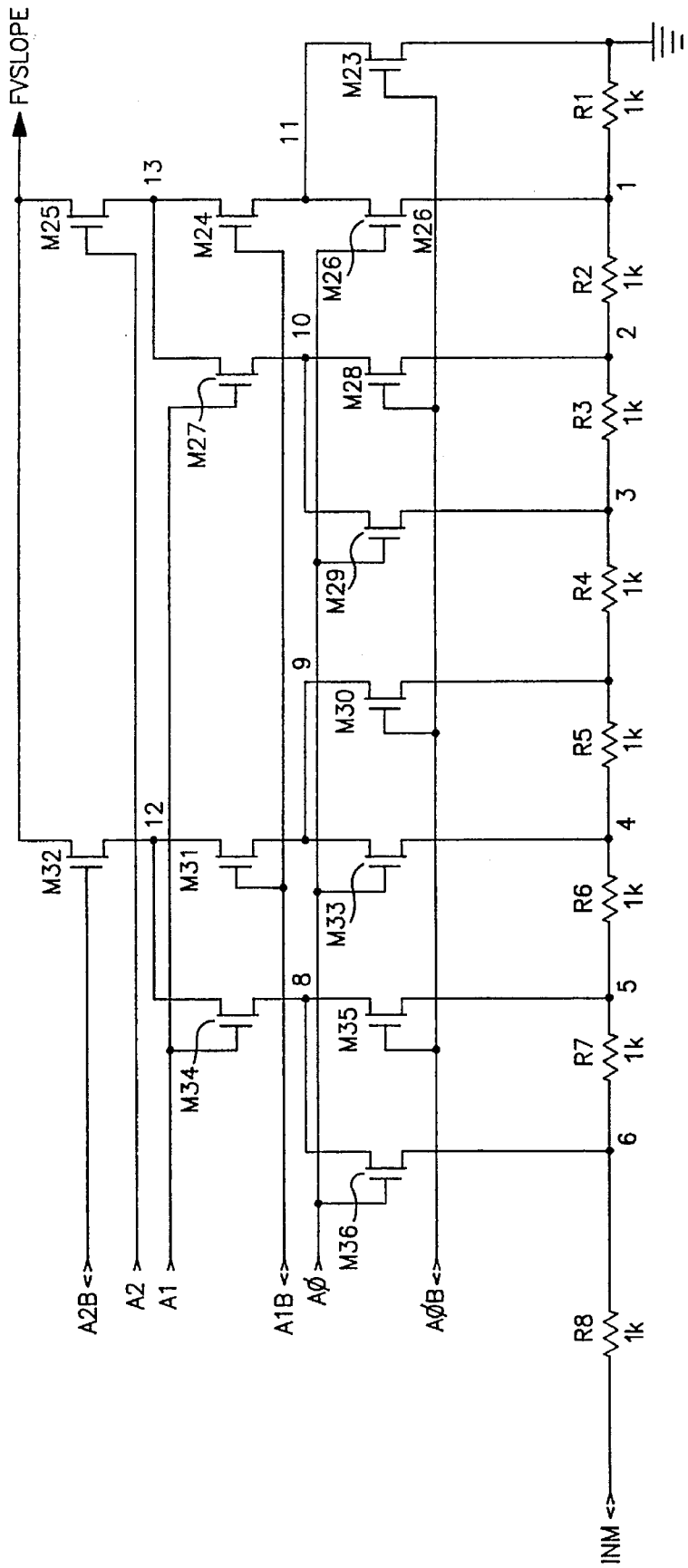

In FIG. 6, a fixed voltage (FVSTEP) is applied to a switch SW2. This switch is closed during the coarse cycle and passes FVSTEP to FV which drives the bottom plate of C1 in FIG. 3. The new FV is shown in FIG. 5. At the beginning of the fine cycle, it is switched to VSS by transistor T7 temporarily, and then to FVRCTL through switch SW1. At this time, the voltage on FVRCTL will be approximately 1.5 v, (the analog ground reference, VAGND), so FV will couple the top node of C1 downward by VSD or approximately the voltage VSD=FVSTEP–(0 v+VAGND). Note that the top plate voltage change is not exactly equal to the bottom plate, FV, voltage change because of the parasitic capacitance on the top plate node of C1, but this is small and will cause only a negligible difference in the coupled voltage.

Now if the voltage of FVSTEP can be adjusted and controlled on silicon, then the step down voltage can be "programmed" to the desired level on each circuit as needed. In FIG. 7, the means to control the value of FVSTEP is shown. Here the output of an opamp, OPDRV, is connected to a resistor chain, R1 to R16. An intermediate node, INM, of the resistor chain, in this case between R8 and R9, is connected to the negative or minus input of the opamp. A voltage reference AGND, (the analog ground reference, approx. 1.5 v), is connected to the positive or plus input of the opamp. This causes the output INP to reach a level which forces the node INM to be approximately equal to the reference AGND. As INP is at a higher voltage than AGND, then all intermediate voltages to the resistor divider network between R9 and R16 will also be above AGND. For this embodiment, equal resistors were used for R10 to R16, but R9 was made equal to seven times the unit value of R10, which gives voltage increments of 1/14 (INP–AGND) for the intermediate nodes. In the preferred embodiment, the voltage INP=3.5 v, with each intermediate node being 0.143 v less than the previous. Now a network of p-channel transistors T24 to T37 are connected as a switching network, to be able to connect one of the intermediate resistor nodes and hence various voltages between INP and AGND, to FVSTEP. (Other or additional switches could be used.) Signals B0, B1, B2 and their inverse control the switches. These are digital signals, and can be programmed high or low using standard EEPROM cells with a digital stored level. This allows the voltage FVSTEP and hence the step down voltage, VSD, to be modified and controlled after fabrication.

Figure 8:
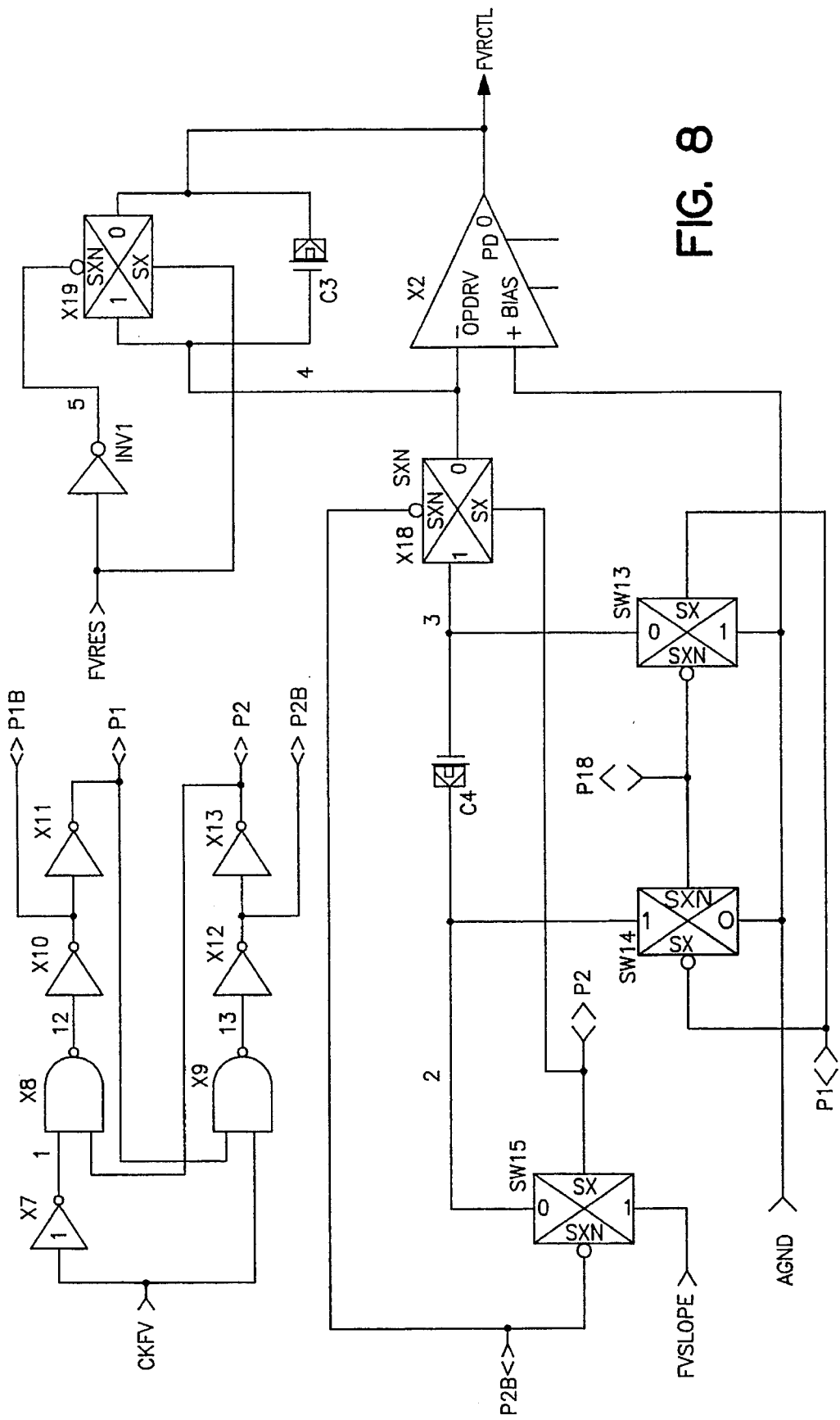
FIG. 8 is a circuit diagram showing the circuit which drives the signal FVRCTL.

The ramp rate of the fine cycle high voltage increments can be controlled by a capacitor integrator, though it would be obvious to someone skilled in the art to use other methods to implement the ramp control. In FIG. 8, a circuit is shown which drives the signal FVRCTL. This is the same signal which was input to the switch SW1 of FIG. 6. The opamp OPDRV and the capacitors C3 and C4 form the primary components of the integrator. A standard non overlapping clock generator, driven by CKFV, gives one clock pulse for each fine high voltage pulse, with P1 having equal phase as CKFV and P2 having the opposite phase. Switches SW12 through SW14 are used to couple charge from C4 to C3. When the signal FVRES is high, the output INV1 is low and the switch SW11 is closed, so the output FVRCTL is shorted to the minus input OPDRV through the switch. This puts the opamp in a standard unity gain mode and the output is driven to approximately 1.5 v (the analog ground reference, AGND), which is connected to the plus input of the opamp. This was the required starting point for the fine cycle for FVSTEP to be referenced to in order to control the step down voltage VSD. Once FV has been switched to FVRCTL, FVRES can go low and release the output FVRCTL. At this time, C3 has been discharged and has 0 v across it. CKFV was high and C4 has 0 v across it, with AGND driven to both sides of C4 through the closed switches, SW13 and SW14.

Various signals of FIG. 8 are shown in FIG. 5. Each low going level of CKFV opens switches SW13 AND SW14, then closes switches SW12 AND SW14. This connects one side of C4 to the minus input of the opamp and the other to the signal, FVSLOPE. If FVSLOPE is below AGND, then this will couple the minus input low. The resulting potential difference between the plus input and the minus input will be amplified by OPDRV and the output will begin to be driven high. As the output is rising, C3 will couple the minus input high until the minus input is again approximately equal to the plus input or AGND. The resulting increase in the output FVRCTL is directly transferred to FV. The amount 6 f increase is related to the charge, Q, which is transferred from C3 to C1. As Q=CV, then Q4=(C4)(V4)=Q3=(C3)(V3), where V4 is the change in voltage across C4 (AGND–FVSLOPE), and V3 is the net increase of FVRCTL or [FVRCTLN–FVRCTL(n–1)], so V3=(C4/C3) V4. In the preferred embodiment of the present invention, C3 was chosen to be 45 times larger than C4, though of coarse other values could be used. If FVSLOPE were 0.5 v, then each increment would be (1/45) (1.5–0.5 v) or about 22 mv per pulse. With 90 pulses, the total change would be 2 v, which would be equal to the previous ramp rate of the prior art. Note that if the increment were different, then the ending value of FVRCTRL may be different from FVSTEP, but it would be switched back to FVSTEP before the next cycle.

If the voltage FVSLOPE were adjusted and controlled on silicon, however, then the increment of FVRCTL and hence the ramp rate of FV could be programmed as needed. Now referring to FIG. 7 again, the same resistor chain used for the FVSTEP programming is used to program the FVSLOPE. (Of coarse separate circuits could have been used.) In this case, resistors R1 to R7 are of equal value and R8 was chosen to equal seven times the unit value of R1. When INM is approximately equal to AGND, as described previously, then the intermediate nodes of R1 to R7 have voltage increments of 1/14 (AGND–0 v). In the preferred embodiment, the voltage of FVSLOPE is 0 v to 0.75 v, with each intermediate node about 0.107 v more than the previous. Similar to the control of FVSTEP, a network of n-channel transistors T40 to T53 are connected as a switching network to be able to connect one of the intermediate resistor nodes, and hence one of various voltages between 0 v and AGND, to FVSLOPE. Other or additional switches could be used. Signals A0, A1, A2, and their inverse control the switches. These are digital signals and can be programmed high or low using standard EEPROM cells with a digital stored level. This allows the voltage FVSLOPE and hence the ramp rate of FV to be modified and controlled on silicon.

The third and sixth parameters, 3) the pulse width of each fine pulse and 6),the pulse width of each coarse pulse, can be reprogrammed by direct digital inputs to the digital logic which controls them.

In FIG. 4, a high frequency clock, CPED, drives a clock divider, with multiple divisions of the clock as outputs. Programmable signals C0 and C1 select one of four outputs to drive the CRCK signal. The period of CRCK then controls the time allowed for each high voltage pulse and, hence, the pulse width of each high voltage pulse. With this method, one of four variations could be selected. It should be obvious to anyone skilled in the art that other combinations could be easily implement with different digital logic, or that an analog controlled oscillator could be used. Also it should be obvious that logic could be added which would independently control the width of the coarse and fine pulses separately if desired.

The fourth and seventh parameters, 4) the number of fine pulses, and 7) the number of coarse pulses, can be reprogrammed by direct digital inputs to the digital logic which controls them.

In FIG. 4, the CRCK clock drives a counter which is essentially counting the number of high voltage pulses, with a plurality of counter outputs available. Specific outputs of this counter would normally drive the high voltage control logic directly. However a plurality of digital multiplexers could be inserted to select different counter outputs. These different counts are then used by the HV control logic to determine the number of coarse and fine pulses allowed during a cycle. FIG. 4 shows Q10 of the counter driving a signal QCLR. In this implementation, Q10 would indicate 10 counts of CRCK. The signal QCLR is used for the time allowed for a clear operation which precedes any writing. The programmable signal D0 selects either Q55 or Q75 to drive the signal QCRSE. This signal is used to determine the number of coarse pulses, NC, in a cycle by NC=(QCRSE–QCLR), so if QCRSE=Q55, then NC=55–10=45 pulses as in the prior art. If Q75 was selected, then NC=65 and the programmed level of D0 controls the number of pulses.

Similarly, the programmable signal d1 selects either Q145 or Q185 to drive the signal QF. The number of fine pulses, NF, in a cycle is NF=(QF−QCRSE) so if QF selects Q145 and QCRSE selects Q55, NF=145−55=90 pulses as in the prior art. If QF selects Q185 and QCRSE selects Q75, then NF−110 pulses and the programmed level of D0 controls the number of pulses. Of coarse a plurality of counts could be selected with a plurality of programmable signals. It should be obvious to anyone skilled in the art that other combinations could be easily implemented with different digital logic.

Figure 9A:
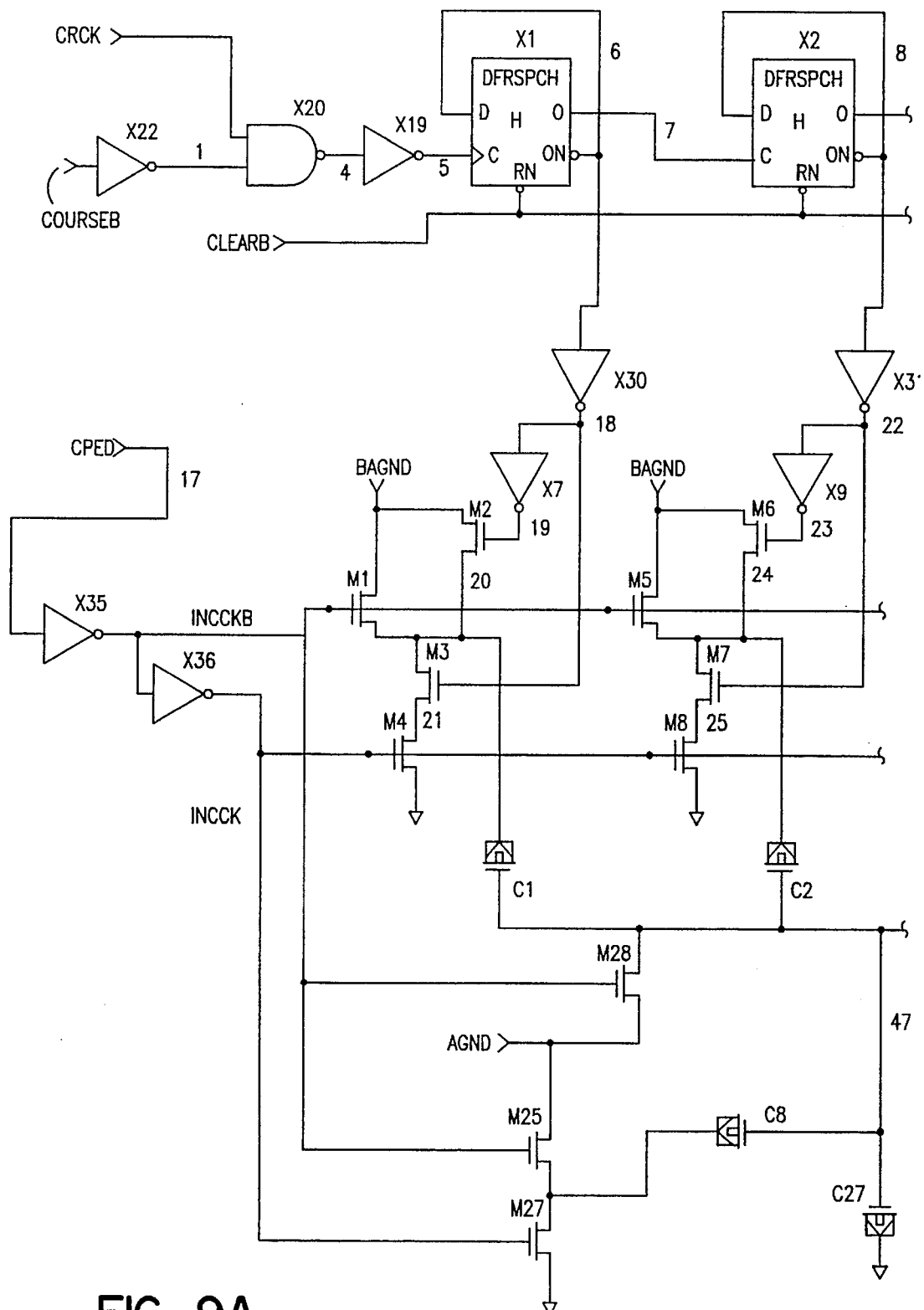
FIGS. 9A–9C is a circuit diagram showing the circuit that may be altered to adjust the incremental voltage increase between each coarse pulse.
Figure 9B:
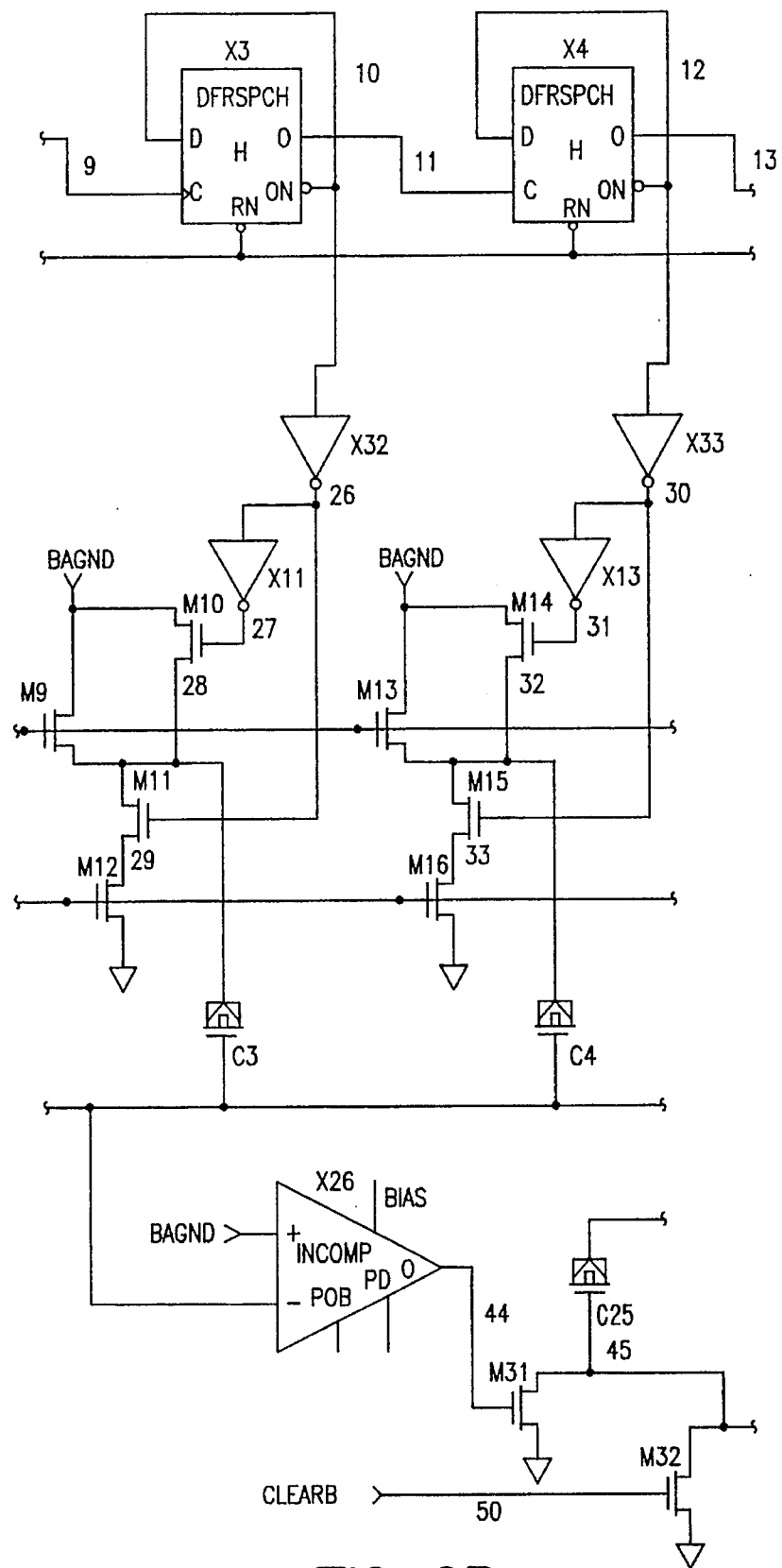
Figure 9C:
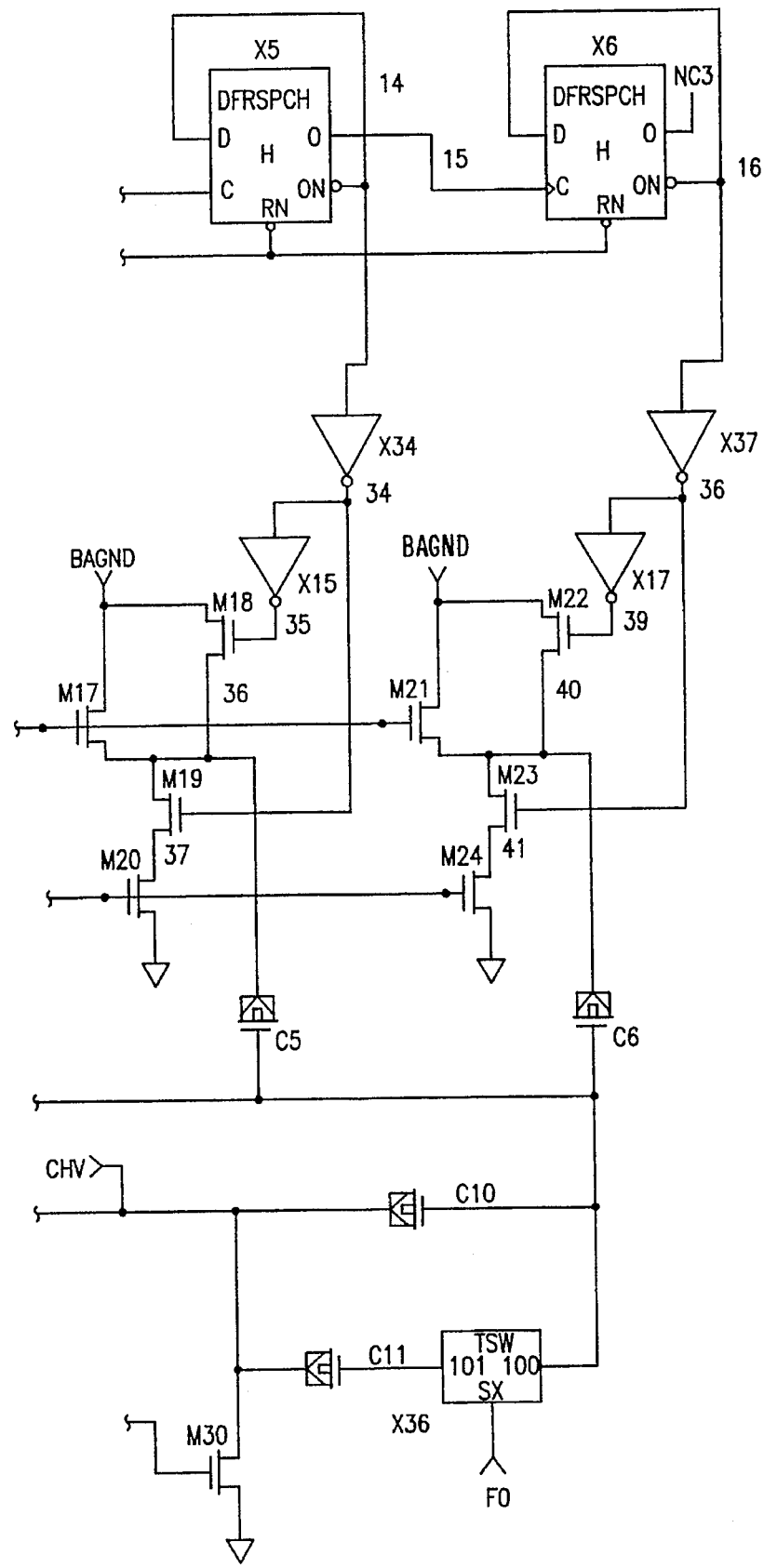

The fifth parameter, 5) the incremental voltage increase between each coarse pulse, can be adjusted by altering the circuit shown in FIG. 9. This circuit uses a capacitor divider network to establish a reference between CHV and VSS. This reference is then compared to the analog ground level AGND by INCOMP which drives T31, which drives T30 which regulates CHV. If the CHV level is too low, then the reference will be lower than AGND and the output of INCOMP will go higher, turning T31 on. Then T31 will drive the gate of T30 lower, reducing its drive strength and allowing CHV to go higher. The converse will happen if CHV is too high. With each increment of CRCK, a plurality of flip-flops act as a counter. The output of each of a plurality of flip-flops will drive a set of transistors which will drive VSS or AGND to one side of a respective one of plurality of capacitors. These capacitors, C1 to C6 in FIG. 9, are connected to the common reference node and form part of the capacitor divider network. The signal CPED will reset the reference node to AGND so that it will start from a known level. Then with each count, a different combination of capacitors C1 to C6 are connected to AGND, which causes no change in CHV or VSS, causing CHV to increase by an amount so that C10 will couple the reference node back to approximately AGND level. As shown, unit capacitors are used for C1 to C6, with C2 being double C1, C3 being twice as big as C2, etc. This results in the same increase of CHV for each count of CRCK. Of coarse different ratios could be used with different increments between each pulse. The resulting increment VC is then found from the amount of charge, Q, which must be transferred from C10 to C1, the unit increase of capacitance connected to VSS with each pulse. Then Q10=(C10×VC)= Q1=(C1)(AGND), so VC=AGND(C1/C10). The programmable signal E0 will close the switch SW1 which will connect a capacitor, C11, in parallel to C10 which will change its value. This directly changes the increment voltage VC between coarse pulses. Of coarse a plurality of switches could be used with a plurality of capacitors in parallel.

Figure 10:
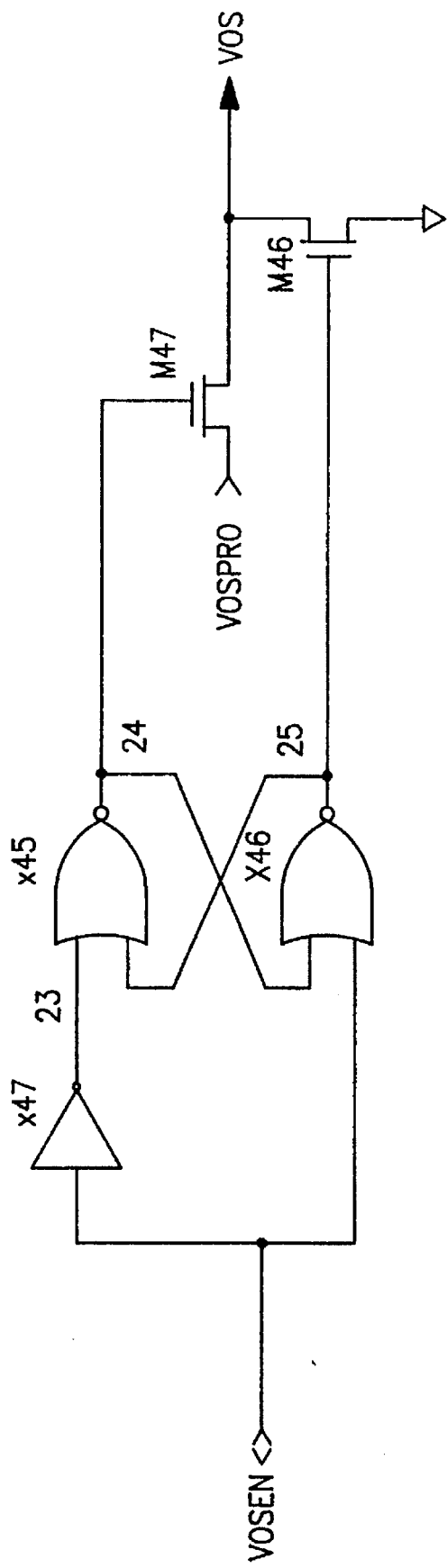
FIG. 10 is a circuit diagram showing the circuit for generating the signal VOS.

The eighth parameter can be reprogrammed by direct digital inputs to a circuit which programs a voltage reference which may switch on the capacitor input and hence alter its coupling to the other capacitors and consequently the amount of VOS which is coupled to the comparator input. In FIG. 10, a signal VOSPRO is shown as connected to the drain of T47. When VOSEN goes high, then VOS is switched between VSS and VOSPRO. If VOSPRO equals AGND, then VOS switches from 0 v to 1.5 v and drives the capacitor C2 in FIG. 3 which couples to C1 and the gate of T8 as described in the prior art. In a manner very similar to FVSTEP and FVSLOPE, a resistor string reference may be established, with a programmable multiplexer to select the VOSPRO voltage. In fact the same resistor string in FIG. 7 may be used with an additional set of multiplexed transistors, driven by programmable signals F0 to F2.

Another method which is not shown in a Figure is to use some multiplexer network which will switch various different sized capacitors into C1 and C2 of FIG. 2, which will change the various capacitor ratios and hence the VOS offset. Of coarse other methods of comparators with offset techniques could be programmable in different ways. For example, if a differential comparator were used, then digital bits or an analog signal, could be used to switch the amount of bias current to one side of the differential stage. This would cause an offset voltage on the input to compensate for the change in current for the output to reach an equilibrium state.

While the preferred embodiment of the present invention has been disclosed and described herein, it will be obvious to those skilled in the art that various changes in form and detail may be made therein without departing from the spirit and scope thereof.

We claim:

1. In a floating gate analog storage device having a plurality of floating gate analog storage cells, each programmable to store an analog value by a multi iterative programming technique in which programming is accomplished by a series of coarse programming pulses of increasing voltage amplitude, the coarse programming pulses being terminated with respect to a particular storage cell when the storage cell reaches a desired coarse programming level, followed by a series of fine programming pulses of increasing voltage amplitude, the fine programming pulses being terminated with respect to that storage cell when the storage cell reaches a desired fine programming level, wherein voltage amplitude increments between the coarse programming pulses are larger than voltage amplitude increments between the fine programming pulses, the improvement comprising:

means for controllably programming after fabrication of the floating gate analog storage device a reduction in a programming pulse voltage for a first fine programming cycle for the storage cell relative to a voltage amplitude of the coarse programming pulse of a last coarse programming cycle for that storage cell;

means for programming after fabrication of the floating gate analog storage device, the voltage amplitude increment between each fine programming pulse;

means for programming after fabrication of the floating gate analog storage device, a pulse width of each fine programming pulse;

means for programming after fabrication of the floating gate analog storage device, the number of fine programming pulses in the series of fine programming pules;

means for programming after fabrication of the floating gate analog storage device, the voltage amplitude increment between each coarse programming pulse;

means for programming after fabrication of the floating gate analog storage device, a pulse width of each coarse programming pulse;

means for programming after fabrication of the floating gate analog storage device, the number of coarse programming pulses in the series of coarse programming pulses; and, means for programming after fabrication of the floating gate analog storage device, an offset voltage which stops further coarse programming pulses and holds the voltage amplitude of the last coarse programming pulse as a reference for a following fine programming cycle for that storage cell.

2. A floating gate analog storage device comprising:

a plurality of floating gate analog storage cells, each of the plurality of floating gate analog storage cells is programmable to store an analog value;

circuitry for programming each of the plurality of floating gate analog storage cells by a multi iterative programming technique in which programming is accomplished by a series of programming pulses of increasing voltage amplitude which are terminated with respect to a storage cell when the storage cell reaches a desired programming level; and circuitry for programming, after fabrication of the floating gate analog storage device, a voltage amplitude increase between each of the programming pulses for that storage cell.

3. The floating gate analog storage device of claim 2 further including circuitry for programming, after fabrication of the floating gate analog storage device, a width of each programming pulse.

4. The floating gate analog storage device of claim 2 further including circuitry for programming, after fabrication of the floating gate analog storage device, the number of pulses in the series of programming pulses.

5. The floating gate analog storage device of claim 2 further including circuitry for programming, after fabrication of the floating gate analog storage device, a width of each programming pulse and the number of programming pulses in the series of programming pulses.

6. A floating gate analog storage device comprising:

a plurality of floating gate analog storage cells, each of the plurality of floating gate analog storage device cells is programmable to store an analog value;

circuitry for programming each of the plurality of floating gate analog storage device cells by a multi iterative programming technique in which programming is accomplished by a series of coarse programming pulses of increasing voltage amplitude, the coarse programming pulses being terminated with respect to a particular storage cell when the storage cell reaches a desired coarse programming level, followed by a series of fine programming pulses of increasing voltage amplitude, the fine programming pulses being referenced by a last coarse programming pulse of the series of coarse programming pulse and are terminated with respect to that storage cell when the storage cell reaches a desired fine programming level, wherein voltage amplitude increments between the coarse programming pulses are larger than voltage amplitude increments between the fine programming pulses; and circuitry for programming, after fabrication of the floating gate analog storage device, a step down voltage from the series of coarse programming pulses to the series of fine programming pulses for that storage cell.

7. The floating gate analog storage device of claim 6 further including circuitry for programming, after fabrication of the floating gate analog storage device, the voltage amplitude increment between programming pulses in one of the series of coarse programming pulses and fine programming pulses.

8. The floating gate analog storage device of claim 6 further including circuitry for programming, after fabrication of the floating gate analog storage device, the voltage amplitude increment between the programming pulses in each of the series of coarse programming pulses and the series of fine programming pulses.

9. The floating gate analog storage device of claim 6 further including circuitry for programming, after fabrication of the floating gate analog storage device, a width of each pulse in one of the series of coarse programming pulses and fine programming pulses.

10. The floating gate analog storage device of claim 6 further including circuitry for programming, after fabrication of the floating gate analog storage device, a width of each pulse in each of the series of coarse programming pulses and the series of fine programming pulses.

11. The floating gate analog storage device of claim 6 further including circuitry for programming, after fabrication of the floating gate analog storage device, the number of pulses in one of the series of coarse programming pulses and fine programming pulses.

12. The floating gate analog storage device of claim 6 further including circuitry for programming, after fabrication of the floating gate analog storage device, the number of pulses in each of the series of coarse programming pulses and the series of fine programming pulses.

13. The floating gate analog storage device of claim 6 further including circuitry for programming after fabrication of the floating gate analog storage device the voltage amplitude increment between programming pulses in one of the series of coarse programming pulses and fine programming pulses, and circuitry for programming after fabrication of the floating gate analog storage device a width of each programming pulse in one of the series of coarse programming pulses and fine programming pulses.

14. The floating gate analog storage device of claim 6 further including circuitry for programming after fabrication of the floating gate analog storage device the voltage amplitude increment between programming pulses in each of the series of coarse programming pulses and the series of fine programming pulses, and circuitry for programming after fabrication of the floating gate analog storage device a width of each programming pulse in each of the series of coarse programming pulses and fine programming pulses.

15. The floating gate analog storage device of claim 6 further including circuitry for programming after fabrication of the floating gate storage device the voltage amplitude increment between programming pulses in one of the series of coarse programming pulses and fine programming pulses, and for programming after fabrication of the floating gate analog storage device the number of programming pulses in one of the series of coarse programming pulses and fine programming pulses.

16. The floating gate analog storage device of claim 6 further including circuitry for programming after fabrication of the floating gate analog storage device the voltage amplitude increment between programming pulses in each both of the series of coarse programming pulses and the series of fine programming pulses, and for programming after fabrication of the floating gate analog storage device the number of pulses in each of the series of coarse programming pulses and the series of fine programming pulses.

17. The floating gate analog storage device of claim 6 further including circuitry for programming after fabrication of the floating gate analog storage device a width of each programming pulse in one of the series of coarse programming pulses and fine programming pulses, and for programming after fabrication of the floating gate analog storage device the number of pulses in one of the series of coarse programming pulses and fine programming pulses.

18. The floating gate analog storage device of claim 6 further including circuitry for programming after fabrication of the floating gate analog storage device a width of each programming pulse in each of the series of coarse programming pulses and the series of fine programming pulses, and for programming after fabrication of the floating gate analog storage device the number of pulses in each of the series of coarse programming pulses and the series of fine programming pulses.

19. The floating gate analog storage device of claim 6 further including circuitry for programming after fabrication of the floating gate analog storage device the voltage amplitude increment between programming pulses in one of the series of coarse programming pulses and fine programming pulses, for programming after fabrication of the floating gate analog storage device a width of each pulse in one of the series of coarse programming pulses and fine programming pulses, and for programming after fabrication of the floating gate analog storage device the number of programming pulses in one of the series of coarse programming pulses and fine programming pulses.

20. The floating gate analog storage device of claim 6 further including circuitry for programming after fabrication of the floating gate analog storage device the voltage amplitude increment between programming pulses in each of the series of coarse programming pulses and the series of fine programming pulses, for programming after fabrication of the floating gate analog storage device a width of each programming pulse in each of the series of coarse programming pulses and the series of fine programming pulses, and for programming after fabrication of the floating gate analog storage device the number of pulses in each of the series of coarse programming pulses and the series of fine programming pulses.

21. The floating gate analog storage device of any one of claims 6 through 20 further comprising circuitry for programming after fabrication of the floating gate analog storage device an offset voltage which stops further coarse programming pulses and holds the desired coarse programming level associated with the last coarse of programming pulse as a reference for a following cycle of fine programming pulses for that storage cell.

22. A floating gate analog storage device comprising:

a plurality of floating gate analog storage cells, each of the plurality of floating gate analog storage cells is programmable to store an analog value;

circuitry for programming each of the plurality of floating gate analog storage cells by a multi iterative programming technique in which programming is accomplished by a series of coarse programming pulses of increasing voltage amplitude, the coarse programming pulses being terminated with respect to a storage cell when the storage cell reaches a desired coarse programming level, followed by a series of fine programming pulses of increasing voltage amplitude, the fine programming pulses being terminated with respect to the storage cell when that storage cell reaches a desired fine programming level, wherein voltage amplitude increments between the coarse programming pulses are larger than voltage amplitude increments between the fine programming pulses; and circuitry for programming after fabrication of the floating gate analog storage device, an offset voltage which stops further coarse programming pulses and holds the desired coarse programming level associated with the last coarse programming pulse as a reference for the following series of fine programming pulses for that storage cell.

23. The floating gate analog storage device of claim 22 further including circuitry for programming, after fabrication of the floating gate analog storage device, the voltage amplitude increment between programming pulses in one of the series of coarse programming pulses and fine programming pulses.

24. The floating gate analog storage device of claim 22 further including circuitry for programming, after fabrication of the floating gate analog storage device, the voltage amplitude increment between programming pulses in each of the series of coarse programming pulses and the series of fine programming pulses.

25. The floating gate analog storage device of claim 22 further including circuitry for programming, after fabrication of the floating gate analog storage device, a width of each pulse in one of the series of coarse programming pulses and fine programming pulses.

26. The floating gate analog storage device of claim 22 further including circuitry for programming, after fabrication of the floating gate analog storage device, a width of each pulse in each of the series of coarse programming pulses and the series of fine programming pulses.

27. The floating gate analog storage device of claim 22 further including circuitry for programming, after fabrication of the floating gate analog storage device, the number of pulses in one of the series of coarse programming pulses and fine programming pulses.

28. The floating gate analog storage device of claim 22 further including circuitry for programming, after fabrication of the floating gate analog storage device, the number of pulses in each of the series of coarse programming pulses and the series of fine programming pulses.

29. The floating gate analog storage device of claim 22 further including circuitry for programming after fabrication of the floating gate analog storage device the voltage amplitude increment between programming pulses in one of the series of coarse programming pulses and fine programming pulses, and circuitry for programming after fabrication of the floating gate analog storage device a width of each programming pulse in one of the series of coarse programming pulses and fine programming pulses.

30. The floating gate analog storage device of claim 22 further including circuitry for programming after fabrication of the floating gate analog storage device the voltage amplitude increment between programming pulses in each of the series of coarse programming pulses and the series of fine programming pulses, and circuitry for programming after fabrication of the floating gate analog storage device a width of each pulse in each of the series of coarse programming pulses and fine programming pulses.

31. The floating gate analog storage device of claim 22 further including circuitry for programming after fabrication of the floating gate analog storage device the voltage amplitude increment between programming pulses in one of the series of coarse programming pulses and fine programming pulses, and for programming after fabrication of the floating gate analog storage device the number of pulses in one of the series of coarse programming pulses and fine programming pulses.

32. The floating gate analog storage device of claim 22 further including circuitry for programming after fabrication of the floating gate analog storage device the voltage amplitude increment between programming pulses in each of the series of coarse programming pulses and the series of fine programming pulses, and for programming after fabrication of the floating gate analog storage device the number of pulses in each of the series of coarse programming pulses and the series of fine programming pulses.

33. The floating gate analog storage device of claim 22 further including circuitry for programming after fabrication of the floating gate analog storage device a width of each pulse in one of the series of coarse programming pulses and fine programming pulses, and for programming after fabrication of the floating gate analog storage device the number of pulses in one of the series of coarse programming pulses and fine programming pulses.

34. The floating gate analog storage device of claim 22 further including circuitry for programming after fabrication of the floating gate analog storage device a width of each pulse in each of the series of coarse programming pulses and the series of fine programming pulses, and for programming after fabrication of the floating gate analog storage device the number of pulses in each of the series of coarse programming pulses and the series of fine programming pulses.

35. The floating gate analog storage device of claim 22 further including circuitry for programming after fabrication of the floating gate analog storage device the voltage amplitude increment between programming pulses in one of the series of coarse programming pulses and fine programming pulses, for programming after fabrication of the floating gate analog storage device a width of each pulse in one of the series of coarse programming pulses and fine programming pulses, and for programming after fabrication of the floating gate analog storage device the number of pulses in one of the series of coarse programming pulses and fine programming pulses.

36. The floating gate analog storage device of claim 22 further including circuitry for programming after fabrication of the floating gate analog storage device the voltage amplitude increment between programming pulses in each of the series of coarse programming pulses and the series of fine programming pulses, for programming after fabrication of the floating gate analog storage device a width of each pulse in each of the series of coarse programming pulses and the series of fine programming pulses, and for programming after fabrication of the floating gate analog storage device the number of pulses in each of the series of coarse programming pulses and the series of fine programming pulses.

* * * * *

UNITED STATES PATENT AND TRADEMARK OFFICE
CERTIFICATE OF CORRECTION

PATENT NO. : 5,623,436
DATED : April 22, 1997
INVENTOR(S) : Sowards et al.

Page 1 of 1

It is certified that error appears in the above-identified patent and that said Letters Patent is hereby corrected as shown below:

Title page,
Item [57], Abstract, delete "pulse width of each course" and insert -- pulse width of each coarse --.

Column 2,
Line 32, delete "diagram" and insert -- diagrams --.
Line 36, delete "is a circuit diagram" and insert -- are circuit diagrams --.

Column 13,
Line 48, delete "Of coarse a" and insert -- Of course a --.

Column 14,
Line 35, delete "of the coarse" and insert -- of a coarse --.

Signed and Sealed this

Twenty-third Day of April, 2002

Attest:

JAMES E. ROGAN
Attesting Officer
Director of the United States Patent and Trademark Office